United States Patent [19]

Sun

[11] Patent Number: 5,245,338
[45] Date of Patent: Sep. 14, 1993

[54] HIGH-SPEED VARIABLE-LENGTH DECODER

[75] Inventor: Ming-Ting Sun, Holmdel, N.J.

[73] Assignee: Bell Communications Research, Inc., Livingston, N.J.

[21] Appl. No.: 893,264

[22] Filed: Jun. 4, 1992

[51] Int. Cl.$^5$ ............................................. H03M 7/40
[52] U.S. Cl. ......................................... 341/67; 341/65
[58] Field of Search ........................ 341/63, 64, 65, 67

[56] References Cited

U.S. PATENT DOCUMENTS

| | | | |
|---|---|---|---|
| 3,675,212 | 7/1972 | Raviv et al. | 340/172.5 |
| 3,717,851 | 2/1973 | Cocke et al. | 340/172.5 |
| 5,032,838 | 7/1991 | Murayama et al. | 341/67 |
| 5,055,841 | 10/1991 | Cordell | 341/67 |
| 5,162,795 | 11/1992 | Shirota | 341/67 |

OTHER PUBLICATIONS

J. W. Peake, "Decompaction", *IBM Technical Disclosure Bulletin*, vol. 26, No. 9, Feb. 1984, pp. 4794–4797.

*Primary Examiner*—Howard L. Williams
*Attorney, Agent, or Firm*—Leonard Charles Suchyta; Stephen M. Gurey

[57] ABSTRACT

A variable-length decoder is disclosed which includes a decoder part (101) and an interface part (102). The decoder part includes two decoder latches (110 and 111) which store consecutive sequences of bits, which are each equal in length to the maximum-length codeword. A decoder barrel shifter (109) provides an output decoding window of a subsequence of bits in the two latches equal in length to the maximum-length codeword. This subsequence is supplied to a memory device (116) which provides a corresponding decoded codeword output and codeword-length output for each subsequence that begins with the first bit of a variable-length to be decoded. At each clock cycle, the same subsequence is supplied to the input of the first decoder latch and the decoder barrel shifter is shifted by the codeword-length of the previous word so that the decoder barrel shifter output subsequence always begins with the first bit of the word to be decoded. The interface part supplies the second decoder latch. The interface part includes an interface barrel shifter (127) which is supplied from two interface latches (125 and 126) which in turn are provided input from a buffer (106) which stores the input bit stream in fixed-length segments. An accumulator (130, 131) accumulates the codeword-lengths of decoded codewords and, at each clock cycle, shifts the output of the interface barrel shifter in accordance with the accumulated lengths so that the bits in its output window are consecutive with the bits in the output window of the decoder barrel shifter. When the accumulated codeword-lengths indicate that all the bits in the first interface latch have been transferred to the decoder part, then a new segment is retrieved from the buffer and stored in the second interface latch while the previous segment in that latch is transferred into the first interface latch.

5 Claims, 3 Drawing Sheets

FIG. 2A

| CLK | LATCH 110 | LATCH 111 | LATCH 125 | LATCH 126 | LEAD 105 | READ | BS 109 SHIFT | BS 127 SHIFT | CARRY |
|---|---|---|---|---|---|---|---|---|---|
|  | x | x | x | x | $a_1-a_8b_1-b_6c_1c_2$ | 1 | 16 | 16 | 1 |
| 1 | x | x | x | x | $c_3-c_5d_1-d_{13}$ | 1 | 16 | 16 | 1 |
| 2 | x | x | x | $a_1-a_8b_1-b_6c_1c_2$ | $d_{14}d_{15}e_1-e_{12}f_1f_2$ | 1 | 16 | 16 | 1 |
| 3 | $a_1-a_8b_1-b_6c_1c_2$ | $c_3-c_5d_1-d_{13}$ | $a_1-a_8b_1-b_6c_1c_2$ | $c_3-c_5d_1-d_{13}$ | $f_3-f_{10}g_1-g_8$ | 1 | 8 | 8 | 0 |
| 4 | $b_1-b_6c_1-c_5d_1-d_5$ | $d_6-d_{15}e_1-e_6$ | $c_3-c_5d_1-d_{13}$ | $d_{14}d_{15}e_1-e_{12}f_1f_2$ | $f_3-f_{10}g_1-g_8$ | 0 | 6 | 14 | 0 |
| 5 | $c_1-c_5d_1-d_{11}$ | $d_{12}-d_{15}e_1-e_{12}$ | $c_3-c_5d_1-d_{13}$ | $d_{14}d_{15}e_1-e_{12}f_1f_2$ | $f_3-f_{10}g_1-g_8$ | 0 | 5 | 19 | 1 |
| 6 | $d_1-d_{15}e_1$ | $e_2-e_{12}f_1-f_5$ | $d_{14}d_{15}e_1-e_{12}f_1f_2$ | $f_3-f_{10}g_1-g_8$ | $gg h_1-h_{15}$ | 1 | 15 | 18 | 1 |
| 7 | $e_1-e_{12}f_1f_4$ | $f_5-f_{10}g_1-g_8$ | $f_3-f_{10}g_1-g_8$ | $gg h_1-h_{15}$ | $h_{16}...$ | 1 | 12 | 14 | 0 |
| 8 | $f_1-f_{10}g_1-g_6$ | $g_7-gg h_1-h_{13}$ | $f_3-f_{10}g_1-g_8$ | $gg h_1-h_{15}$ | $h_{16}...$ | 0 | 10 | 24 | 1 |
| 9 | $g_1-gg h_1-h_7$ | $h_8-h_{16}...$ | ... | ... | ... | . | . | . | . |

| CLK | BARREL SHIFTER 109 OUTPUT | BARREL SHIFTER 127 OUTPUT | DECODED WORD | LENGTH |
|---|---|---|---|---|
|   | X | X | X | X |
| 1 | X | $a_1-a_8b_1-b_6c_1c_2$ | X | X |
| 2 | $a_1-a_8b_1-b_6c_1c_2$ | $c_3-c_5d_1-d_{13}$ | A | 8 |
| 3 | $b_1-b_6c_1-c_5d_1-d_5$ | $d_6-d_{15}e_1-e_6$ | B | 6 |
| 4 | $c_1-c_5d_1-d_{11}$ | $d_{12}-d_{15}e_1-e_{12}$ | C | 5 |
| 5 | $d_1-d_{15}e_1$ | $e_2-e_{12}f_1-f_5$ | D | 15 |
| 6 | $e_1-e_{12}f_1-f_4$ | $f_5-f_{10}g_1-g_8$ | E | 12 |
| 7 | $f_1-f_{10}g_1-g_6$ | $g_7-g_9h_1-h_{13}$ | F | 10 |
| 8 | $g_1-g_9h_1-h_7$ | $h_8-h_{16}...$ | G | 9 |
| 9 | $h_1-h_{16}$ |  | H | 16 |

| FIG. 2A |
|---|
| FIG. 2B |

| $a_1...a_8$ | $b_1...b_6$ | $c_1...c_5$ | $d_1...d_{15}$ | $e_1...e_{12}$ | $f_1...f_{10}$ | $g_1...g_9$ | $h_1...h_{16}$ |

INPUT BIT STREAM

HIGH-SPEED VARIABLE-LENGTH DECODER

BACKGROUND OF THE INVENTION

This invention relates to decoding codewords in a high speed data transmission system, and more particularly to decoding codewords which have been encoded using a variable-length coding (VLC) scheme.

Variable-length coding is a coding technique often used for lossless data compression. In accordance with this technique, fixed-length data is converted into variable-length codewords according to the statistics of the data. In general, the lengths of the codewords are chosen so that shorter codewords are used to represent the more frequently occurring data and longer codewords are chosen to represent the less frequently occurring data. By properly assigning the variable-length codewords to the library of all possible source codewords, the averaged word length of the variable-length code is shorter than that of the original data and, therefore, data compression is achieved. Huffman code design is a procedure commonly used to construct a minimum redundant variable-length code for a known data statistic. Generally, the encoding process can be implemented by a table-lookup process using the input data to address the table. The codewords and word-lengths are stored as table contents. The code-lengths are used to control interface circuitry to concatenate the variable-length words into a serial bit stream, which is then segmented into fixed-length data segments. The fixed-length data segments are then outputted sequentially, through a buffer, at a constant data rate onto the data channel. At the receiving end, it is difficult to design a decoder to achieve high speed operations. Due to the variable-length nature, each codeword has to be segmented from the received bit string before it can be decoded into a source symbol. This is a recursive operation which cannot be pipelined. Therefore, the design of a high-speed variable-length decoder is always more difficult than the design of a high-speed variable-length encoder.

There are several methods to decode a stream of variable-length codewords. The one most often used is called the tree-searching algorithm. A variable-length code can always be represented by a tree with codewords as leaves (also called terminal nodes). The decoding starts from the root of the code tree and is guided by the received bit string to follow one of two branches at each node. When a leaf is reached, the end of a codeword is detected and it is segmented from the remaining string. This type of decoder includes logic circuitry corresponding to the tree and control circuitry to traverse the code tree. This approach may be slow, especially for long codewords, since a bit-by-bit search through the code tree is required for each decoded symbol. In typical applications, an input symbol is represented by several bits. The speed of shifting received bits into a decoder is several times as high as the averaged speed of decoded data. Moreover, a practical system often needs to be designed to handle the worst-case. Therefore, the tree-searching based decoder has to be operated at the speed of several times of the output data rate.

Such high-speed requirements are particularly critical for the digital transmission of high definition television (HDTV) signals. In such an HDTV system the total sample rate (combining luminance and chrominance signals) is likely 100 MHz. If variable-length coding is used, the maximum length code word could typically be 16 bits. In the worst-case, a bit-by-bit decoder would thus need to shift at 16 times the sample rate, or at 1.6 Gbits/sec, to detect the code words at the sample rate. Such high speeds are very difficult to implement using current IC technology.

Due to the difficulty of implementing high-speed variable-length decoders, there are several special variable-length codes designed for fast and inexpensive decoders. For example, a variable-length encoder with a length-indicating prefix is proposed by J. Cocke et al in U.S. Pat. No. 3,717,851 issued Oct. 24, 1972. In "Variable Word Length Coding for a High Data Rate DPCM Video Coder," *Proc. of Picture Coding Symposium*, 1986, pp. 54–56, M. E. Lukacs proposed a hardware architecture that is capable of fast decoding of specially designed variable length codes. These approaches tradeoff coding efficiency with hardware speed.

A table-lookup based approach is an alternative to the bit-by-bit search operation. In a table-lookup based approach, such as disclosed in U.S. Pat. No. 3,675,212, issued on Jul. 4, 1972 to J. Raviv et al, the received bit string is compared with the contents of a codeword table. The codeword table has an entry associated with each possible variable-length codeword that includes the decoded fixed-length word and the length of the variable-length word. When the sequence of leading bits in an input register matches one of the entries in the codeword table, a codeword match is indicated. The input register is then shifted by the number of bits indicated by code length entry, thereby making the next sequence of bits available for comparison with entries in the codeword table. Disadvantageously, bit-by-bit shifting at the very high speed multiple of the sample rate is required to enable the decoder to maintain the sample rate of decoding.

In co-pending a patent application, Ser. No. 546,415, filed Jun. 29, 1990, now U.S. Pat. No. 5,173,695 co-invented by the inventor herein, a high-speed variable-length decoder is described which solves many of the problems of the prior art decoders. That decoder includes two cascaded latch circuits, each having a bit capacity equal to the maximum codeword length and which store consecutive bits supplied from an input buffer memory which stores the stream to be decoded in fixed-length data segments; a barrel shifter, which is input from the two latch circuits and which provides a sliding decoding window output equal in length to the maximum codeword length; an accumulator which accumulates, modulo the maximum codeword length, the lengths of the sequentially decoded variable-length codewords; and a table-lookup memory device, which outputs, for an input sequence of bits that begins with the first bit of a variable-length codeword, a fixed-length word corresponding to that variable-length codeword and that variable-length codeword length. As a codeword is decoded during each clock cycle, its length is accumulated and the decoding window of the barrel shifter is shifted to begin with the first bit of the next to-be-decoded codeword. When, during a clock cycle, the accumulated lengths exceeds the maximum codeword length, which indicates that all the bits in the first latch circuit have been decoded, the bits in the second latch are transferred into the first latch and the next fixed-length data-segment of bits is read into the second latch from the buffer memory. With this decoder, a continuous stream of bits from the buffer is always at-the-ready to be decoded and the variable-length codewords can be decoded at the symbol clock rate without the necessity of clocking bits at a very high bit rate.

In the aforedescribed decoder structure, the speed of operation is limited by the operational delay of the components in a critical path that includes the table-lookup memory, the barrel shifter, and the accumulator. It is the accumulator, which is part of its function controls the reading of the fixed-length data segments from the buffer memory into the second latch, that adds a substantial and significant portion of the total operational delay. This delay will have the a deleterious effect for high-speed decoding, such as will be required for HDTV applications.

An object of the present invention is to provide high-speed decoding of variable-length codewords with a structure that has a minimum of delay inducing components in the critical path.

SUMMARY OF THE INVENTION

The variable-length decoder of the present invention incorporates an improved architecture which still decodes a codeword in each clock cycle regardless of the code-length but which removes the accumulator from the critical path. By removing the accumulator from the critical path, a much higher speed of operation can be achieved. Unlike the prior art architecture of the aforenoted co-pending patent application in which the decoding circuitry and the interface circuitry were integrally related, the architecture of the decoder of the present invention has separate decoder and interface parts. The decoder part includes a table-lookup memory, as in the prior art, which provides a fixed-length decoded word output and a codeword length output for each input segment of bits that begins with the first bit of the unknown variable-length codeword and which segment is equal in length to at least the maximum length variable-length codeword. The decoder part also include a barrel shifter and three decoder latches/bit registers. The output of the barrel shifter provides a sliding decoding window to the table-lookup memory, and which is controlled by the previous decoded codeword length stored in the third decoder latch. Input to the barrel shifter is provided by the first and second decoder latches, each having a bit capacity at least equal to the maximum length variable-length codeword. Together, the first and second decoder latches provide consecutive bits containing at least two variable-length codewords. The output of the barrel shifter, in addition to being connected to the table-lookup memory, is connected to the input of the first decoder latch, while the second decoder latch is provided with an input from the interface part of the variable-length decoder.

At every clock cycle, the barrel shifter outputs the decoding window that begins with the first bit of the to-be-decoded codeword. When the table-lookup memory makes a match, the decoded word and the codeword length are output. At the next clock cycle, the input to the barrel shifter starts with the first bit of the previous decoded word. The decoding window, however, is shifted according to this previous word's codeword length, so that the output window always begins with the first bit of the to-be-decoded word. Since the bits in the first decoder latch are changed at every clock cycle, the second decoder latch is replenished at each cycle from the interface part so that a continuous bit stream beginning with the first bit of the previous decoded codeword is present at the input to the barrel shifter.

The interface part provides the bit inputs to the second decoder latch, but is not in the critical loop. As noted, these bits must be updated during each clock cycle. Input to the second decoder latch of the decoder part is provided from the output of a barrel shifter in the interface part. Input to the interface barrel shifter is provided from two cascaded interface latches, each having a bit capacity at least as large as the maximum codeword length, and from the buffer memory output. The output of the interface barrel shifter is controlled by an accumulator, which accumulates the decoded codeword lengths from the output of the table-lookup memory in the decoder part. At each clock cycle, the output of the interface barrel shifter is shifted according to the accumulated codeword lengths so that its output bits are consecutive with those bits at the output of the decoder barrel shifter. At the next clock cycle, a consecutive bit sequence is thus be present at the input to the decoder barrel shifter. When the accumulated codeword lengths exceed the maximum codeword length during a clock cycle, which indicates that all the bits in the first interface latch have been transferred to the decoder part, a carry signal is generated. At the next clock cycle, in response to this carry signal, the contents of the second interface latch are transferred to the first interface latch, and a new data-segment is retrieved from the buffer memory.

Advantageously, the architecture of the variable-length decoder of the present invention requires clocking at only the symbol rate, and has a critical path that includes only the barrel shifter and table-lookup memory device in the decoder part. The substantial delay causing accumulator, being removed from the critical loop, is therefore not a hardware speed constraint.

BRIEF DESCRIPTION OF THE DRAWING

FIGS. 2A and 2B when placed side by side as shown in FIG. 2C illustrates an example of the operation of the decoder of FIG. 1 through several clock cycles; and FIG. 3 shows the input bit stream used for the example of FIGS. 2A and 2B.

DETAILED DESCRIPTION

Figure 1:
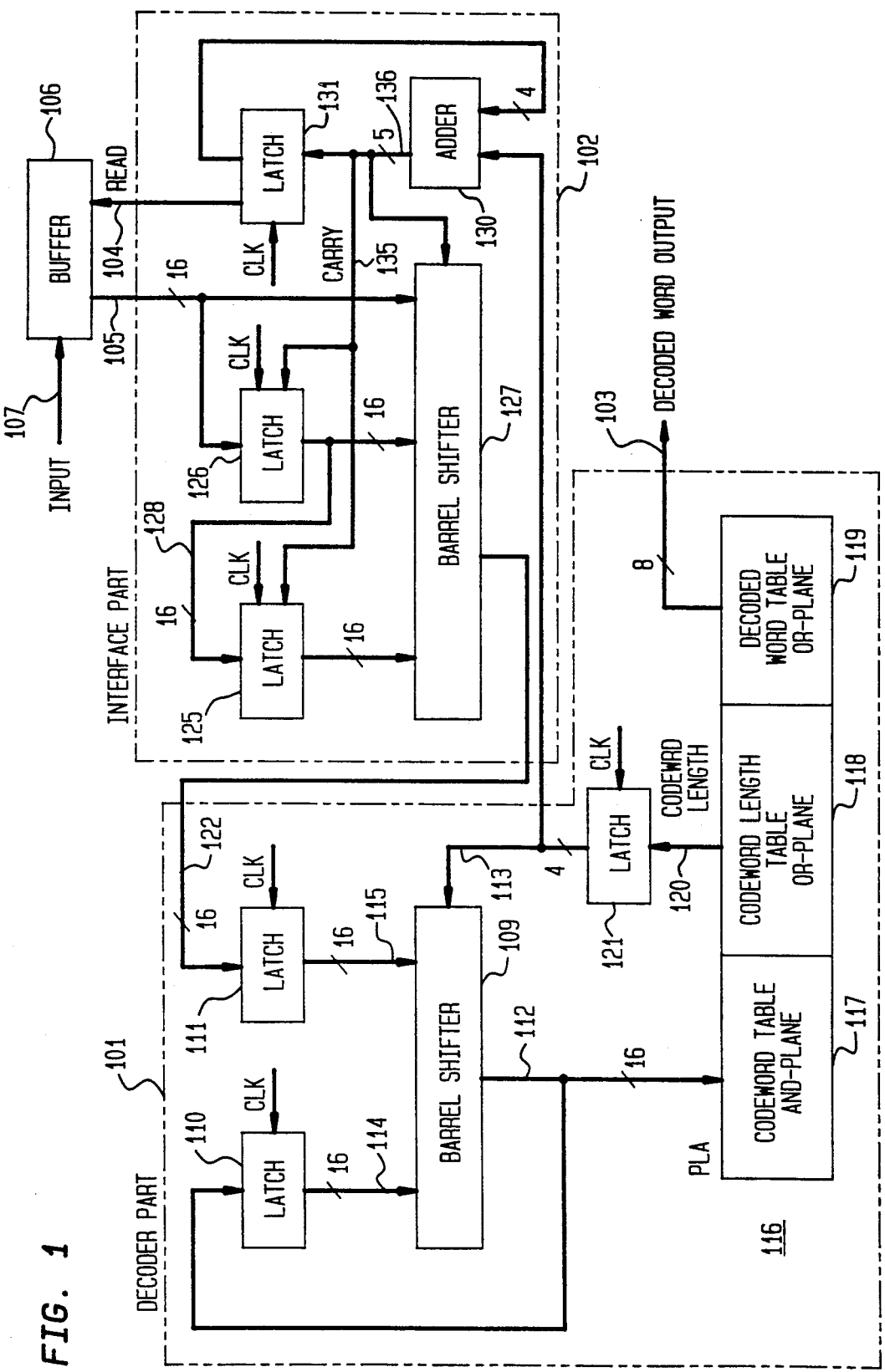
FIG. 1 is a block diagram of the variable-length decoder of the present invention.

With reference to FIG. 1, the variable-length decoder of the present invention includes a decoder part 101 and an interface part 102. The decoder part 101 decodes the successive variable-length codewords input to it in a continuous stream and outputs corresponding decoded fixed-length codewords, at a fixed symbol clock rate, on output lead 103. Interface part 102 provides the interface between an external buffer memory 106 and the decoder part 101. The external buffer memory 106 stores, in fixed-length data segments, the serial bit stream of variable-length words received over data channel 107. As will be described, interface part 102 functions to supply to the decoder part 101, a continuous sequence of bits that allow a codeword to be decoded by decoder part 101 during each clock cycle. When new bits need to be supplied, interface part 102 generates a Read signal on lead 104, and buffer memory 106, in response thereto, supplies the next data segment to interface part 102 over parallel leads 105. The bits in this new segment are concatenated with the bits in the previous segment and shifted, as needed and as will be described, into the decoder part 101.

In the embodiment of the present invention shown in FIG. 1, it is assumed for illustrative purposes that the maximum length variable-length codeword is 16-bits and that the buffer 106 supplies 16-bit segments to the interface part 102 over leads 105.

The decoder part 101 includes a 32-bit input barrel shifter 109. Input to barrel shifter 109 is supplied from 16-bit latches 110 and 111, each chosen to have a bit capacity equal to the maximum codeword length. As is well known to those skilled in the art, a latch is an equivalent term for bit register. Together, latches 110 and 111 provide, over parallel leads 114 and 115, respectively, a sequential 32-bits from the received bit stream and contain therefore, at least two variable-length codewords. The output of barrel shifter 109, on parallel leads 112, is a 16-bit decoding window that is slidable across the 32-bits input to it over leads 114 and 115 from latches 110 and 111, respectively. The shift of the decoding window, is determined by a control signal on parallel leads 113.

The outputs 112 of barrel shifter 109 are connected to a memory device 116. In the described embodiment, memory device 116 takes the form of a programmable logic array (PLA). The PLA in FIG. 1 is shown as comprising a codeword table AND-plane 117, a codeword length table OR plane 118, and a decoded-word table OR-plane 119, but may actually take the form of two PLAs each having an AND- and an OR-plane. Each codeword is represented as an entry in a codeword table AND-plane 117 according to the bit pattern of the codeword. Within the AND-plane 117, the entry for each codeword consists of 16-bit positions. Since most codewords in a codeword library in which the maximum length word is 16-bits have fewer than 16 bits, the bit positions in the table entry for the bits beyond the actual codeword bit pattern are designated "don't care" positions. A codeword is detected when a sequence of input bits on leads 112 matches the bit pattern of one of the codeword bit patterns stored in the codeword table 117. Thus, for example, if one of the variable-length codewords is "01", its 16-bit table entry will be "01XXXXXXXXXXXXXX", where each "X" represents a "don't care." If the 16-bit output of barrel shifter 109 on leads 112 has a pattern "0111110000011101", then it is uniquely identified with this table entry since a match occurs on the first two bits. The first two bits are thus recognized as a variable-length word and a next variable-length word begins at the third bit.

When the bits on leads 112 match an entry in the codeword table AND-plane 117, the corresponding entries in the codeword length table OR-plane 118, and in the decoded word table OR-plane 119, are activated. The decoded word table OR-plane 119 outputs on parallel leads 103 the fixed-length codeword corresponding to the matched variable-length word in the codeword table 117. The codeword length table OR-plane 118 produces an output signal on parallel leads 120 representing the length of the matched variable-length codeword in the codeword table 117. For the example above, the codeword length table 118 outputs a "2", representing the length of the detected word, "01". This codeword length, on leads 120, is latched into latch 121 at the next clock tick. This codeword length, after the next clock tick is used to control the shift of barrel shifter 109 via leads 113, and is also input to an accumulator in interface part 102. As will be described in detail hereinafter, the accumulated decoded codeword lengths are used by interface part 102 to control the bits that are supplied over leads 122 to latch 111 in the decoder part 101.

As previously noted, input to barrel shifter 109 is supplied by latches 110 and 111. The barrel shifter 109 outputs 112, however, are also connected to the input of latch 110. Assuming that the decoding window of barrel shifter 109 is adjusted properly so that the most significant bit (MSB) in the output window is the first bit of a to-be-decoded variable-length word, at the next clock tick, that MSB and the succeeding 15 bits are latched into latch 110. At each clock tick, therefore, the first input bit to barrel shifter 109 is the first bit of the previous decoded codeword. At each of these clock ticks, a next succeeding 16-bit sequence from the input bit stream is latched into latch 111 from interface 102 so that there are always a consecutive 32-bits of the input data stream, beginning with the first bit of the previous decoded word, in barrel shifter 109. Simultaneously, at each clock tick, the codeword length of the previous decoded word is latched into latch 121, thereby appearing on leads 113 as the control input to barrel shifter 109. Since the input to barrel shifter 109 begins with the first bit of the previous decoded word and the control signal on lead 113 is the number of bits in that previous decoded word, the 16-bit decoding output window of barrel shifter 109 on leads 112 always contains the 16-bits of the data stream that begins with the first bit of the to-be-decoded codeword. It can be readily seen, therefore, that at each clock tick the decoding window is directly shifted to the first bit the next word.

At each clock cycle interface part 102 must supply latch 111, over leads 122, with the 16-bits sequence that follows the bits in latch 110. Since the bits in latch 110 are changed at each clock tick, the bits in to latch 111 must also be changed at each clock tick. Interface part 102 consists of two 16-bit latches 125 and 126, a barrel shifter 127, an adder 130, and an accumulator latch 131. The adder 130 and latch 131 form an accumulator. The outputs of latches 125 and 126, and the output of buffer 106 on leads 105, are input to the barrel shifter 127, which during any clock cycle has a consecutive 48-bits of the data stream supplied to its inputs. Barrel shifter 127 has a 16-bit slidable output window across the 48-bits which is controlled, at each clock tick, by the accumulated codeword lengths on leads 136 at the output of adder 130. The bits in this 16-bit output window supply the input, via leads 122, to latch 111 in decoder part 101.

Barrel shifter 127 is supplied by the data segments from buffer 106 that are stored in latches 125 and 126, as well as the current output data segment from buffer 106. Latch 126 is supplied directly from buffer 106 on leads 105 and latch 125 is supplied by latch 126 via leads 128. Latches 125 and 126 are controlled latches which only latch-in the data at their inputs at a clock tick when a signal is present at their control inputs. As will be described, latches 125 and 126 are controlled to read-in the data at their inputs when the adder 130 generates a Carry signal on lead 135, which occurs when the first 16-bits of the data stream in barrel shifter 127 have been read-out to the decoder part 101. In response to a Carry signal, and at the next clock tick, the contents of latch 126 are transferred into latch 125, the 16-bit segment on leads 105 is transferred to latch 126, and the next 16-bit segment is retrieved from buffer 106 to appear at input bit position 33–48 of barrel shifter 127. In this way, a continuous 48-bits from the data stream are always present at the inputs to barrel shifter 127. At clock ticks when a Carry signal is not present at the control inputs to latches 125 and 126, the data in these latches, and the data input to barrel shifter 127, remains unchanged. At each clock tick, however, the 16-bit output window of barrel shifter 127 is slid to a new position that is determined by the accumulated codeword lengths on leads 136 at the output of adder 130.

Accumulator 130 accumulates the previous decoded codeword lengths at the output of latch 121 in the decoder part 101, with the previously accumulated word lengths, modulo-16, in accumulator latch 131, to form a new sum on its five parallel output leads 136. At each clock tick, therefore, the previous codeword length (maximum 16) is added to the modulo-16 previous accumulated lengths in latch 131 to form a sum on leads 136. This sum, between "0" and "31", controls the shift of barrel shifter 127. The MSB output of adder 130, on lead 135, is the Carry signal that is used to control latches 125 and 126, as aforedescribed. When the accumulated codeword lengths are greater than or equal to "16", the MSB of adder 130 output is "1" and a Carry signal appears on lead 135. At the next clock tick this MSB "1" bit appears as a Read signal on lead 104 at the output of latch 131. Buffer 106, in response to this Read signal retrieves the next data segment and outputs it onto leads 105. The Carry signal transfers the previous data segment into latch 126, and the twice previous data segment into latch 125.

By shifting barrel shifter 127 in accordance with the accumulated codeword lengths, its output window can always be maintained in a continuum with the output window of barrel shifter 109 in the decoder part 101. At any clock tick, when the output of barrel shifter 109 is latched into latch 110 and the output of barrel shifter 127 is latched into latch 111, there will be a continuous 32-bits from the input stream present at the input to barrel shifter 109. Since input to latch 111 is never dependent upon a read operation of a data segment from the buffer 106, and input to latch 111 is only from bits already in barrel shifter 127, the interface part 102 imparts no hardware delay to the decoding process.

Figures 2B, 2C, 3:
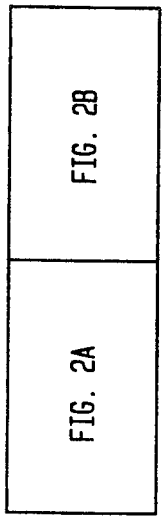

The operation of the decoder in FIG. 1 is more readily understood with reference to an example shown in tabular form in FIGS. 2A and 2B, which should be placed together as shown in FIG. 2C to form a single table. In FIG. 2B, the left-hand most column is a duplicate of the left-hand most column of FIG. 2A for ease of reading. FIGS. 2A and 2B will hereinafter be referred to jointly as FIG. 2. It is assumed that the data stream input from data channel 107 to buffer 106 consists of the bit stream $a_1-a_8b_1-b_6c_1-c_5d_1-d_{15}e_1-e_{12}f_1-f_{10}g_1-g_9-h_1-h_{16}\ldots$, as shown in FIG. 3, where $a_1-a_8$ represents the eight bits in the first variable-length word, $b_1-b_6$ represents the six bits in the second variable-length word, etc.

Prior to the first clock tick, latch 131 is initialized so that it Read output is "1" (noted in FIG. 2 with a surrounding box). Latch 121 is also initialized so that barrel shifter 109 has an initial shift of "16" (also noted with a surrounding box). With "16" input to adder 130 from latch 121 and 16 modulo-16 (equal to "0") also input to adder 130 from latch 131, the output of adder 130, and thus the shift of barrel shifter 127 is "16", with Carry being "1". With Read being "1", the first data segment, consisting of the 16-bits $a_1-a_8b_1-b_6c_1c_2$, is input on leads 105 to the interface part 102. At this time all the latches, the outputs of barrel shifters 109 and 127, and the outputs of PLA 116 are noise values, represented in FIG. 2 with an "X".

At the first clock tick, the previous Carry "1" becomes a Read "1", which retrieves the next data segment from buffer 106 onto leads 105. At this clock tick, however, the previous Carry of "1" causes the previous output of buffer 106 to be read into latch 126. Latch 121 remains initialized at "16", so that the shift of barrel shifter 109 remains "16" and adder 130 remains at "16", together with Read at "1" and Carry at "1". With the shift of barrel shifter 127 being "16" and the 17th–32nd bits being $a_1-a_8b_1-b_6c_1c_2$ from latch 126, that sequence appears at the output of barrel shifter 127. Latches 110, 111, and 125 contain noise, as does the output of barrel shifter 109 and the decoded word and codeword length outputs of PLA 116.

At the second clock tick, the previous output of barrel shifter 127 is latched into latch 111. Since Read is still "1" and the previous carry was "1", the next data segment (the third) is retrieved from buffer 106, the data segment (the first) in latch 126 is latched into latch 125, and the second data segment is latched into latch 126. Latch 121 is still initialized so that the shift of barrel shifter 109 is "16". This maintains the output of adder 130 at "16" and Carry and Read at "1". Since the previous output of barrel shifter 127 consisted of the first data segment, at the second clock tick that segment appears in latch 111 and in the 17–32 input positions of barrel shifter 109. The "16" at the shift input to barrel shifter 109 thereby transfers this first segment to the barrel shifter output on leads 112. The "16" at the shift input of barrel shifter 127 transfers the second data segment, $c_3-c_5d_1-d_{13}$, in latch 126 to the output of barrel shifter 127. The codeword table 117 in PLA 116 recognizes the first eight bits in the first segment as codeword "A". The decoded word table 119 outputs this fixed-length decoded word, A, on leads 103. Codeword length table 118 outputs the length, "8", of this word on leads 120.

On the third clock tick, this first data segment is latched into latch 110, and thus into the first 16-inputs of barrel shifter 109. The previous output of barrel shifter 127, being the second data segment is latched into latch 111 and thus to the second 16-inputs of barrel shifter 109. The previous decoded length, "8", is latched into latch 121, which is therefore the shift of barrel shifter 109. The output of barrel shifter 109 shifted to the 9th–24th input bits, or the sequence $b_1-b_6c_1-c_5d_1-d_5$. The Carry "1" from at the second clock tick become a Read "1" at this third tick, thereby retrieving the next data segment from buffer 106. This previous Carry "1", upon the occurrence of the third tick, transfers the previous segments from buffer 106 to latch 126, and from latch 126 to latch 125. The "8" at the output of latch 121 is added by adder 130 to the previous modulo-16 output of latch 131 (equal to "0") to form a new output equal to "8". The shift of barrel shifter 127 now is "8", with Carry being "0". The output of barrel shifter 127 nows begin with its 9th input, which is $d_6$. This sequence is thus continuous with the sequence at the output of barrel shifter 109, which sequences together will form the inputs to barrel shifter 109 at the next clock tick. During this third clock cycle, codeword B is recognized in the first 6-bits input to codeword table 117, and the fixed-length decoded word B is output on leads 103 and the codeword length "6" is output by codeword length table 118.

Since the previous Carry was "0", at the fourth clock tick the next data segment is not retrieved from buffer 106 and the contents of latches 125 and 126 remain the same as in the previous clock cycle. The previous output of barrel shifter 109 is transferred into latch 110 beginning with bit $b_1$, and the previous output of barrel shifter 127 is shifted into latch 111, beginning with bit $d_6$. The "6" now at the output of latch 121 shifts the barrel shifter 109 output to the 7th–22rd bits, beginning with bit $c_1$ and ending with bit $d_{11}$. This same "6" is added by adder 130 to the previous "8", to produce a shift of "14" to barrel shifter 127. The output of barrel shifter 127 thus begins with the 15th bit input, or $d_{12}$, which is next bit following the last bit in barrel shifter 109. Since the accumulated codeword lengths is still less than "16", the Carry output is still "0". The codeword C is output by decoded word table 119 and its codeword length of "5" is output by codeword length table 118.

At the fifth clock tick the previous output of barrel shifter 112 is latched into latch 110, beginning with bits $c_1$–$c_5$, and the previous output of barrel shifter 127 is latched into latch 111. The output window of barrel shifter 109 is shifted 5-bits in accordance with the previous codeword length thus beginning with bit $d_1$. The "5" in latch 121 is accumulated with the previous "14" in latch 131 to yield "19" at the output of adder 130, which shifts barrel shifter 127 to the 20th–35th bits and produces a carry of "1". The codeword D is output by decoded word table 119 and its length of "15" is output by codeword length table 118.

At the sixth clock tick, Read is "1" since the previous Carry was "1" and the next data segment is retrieved from buffer 106 and input to barrel shifter 127 as the previous segments are shifted into latch 126 and latch 125. In the same manner as previously described the output of barrel shifter 109 is shifted to begin with the first bit of the next-to-be-decoded word, $e_1$. Codeword E is decoded and a Carry is generated when the modulo-16 previous accumulated codeword length, "3", is added to the previous codeword length, "15", to produce an accumulated codeword length of "18".

From the examples illustrated above, the operation of the decoder of FIG. 1 should be obvious to one skilled in the art.

The above-described embodiment is illustrative of the principles of the present invention. Other embodiments could be devised by those skilled in the art without departing from the spirit and scope of the present invention.

What is claimed is:

1. A variable-length decoder for decoding at a fixed clock rate sequential variable-length codewords supplied from an input buffer that stores an input bit stream to be decoded in fixed-length segments which are at least as long as the longest-length variable-length codeword, said decoder comprising an interface part and a decoder part, said decoder part decoding the sequential variable-length codewords at the fixed clock rate, and said interface part retrieving a fixed-length segment as needed from the buffer and supplying bits to be decoded to the decoder part, said decoder part comprising:

memory means for producing a fixed-length codeword in response to each variable-length codeword that begins at the first bit position of an input sequence that is as long as the longest-length variable-length codeword and a codeword-length output corresponding to that variable-length codeword;

first and second decoder bit storage means for storing consecutive fixed-length sequences of bits from the interface part, said fixed-length sequences being equal in bit-length to at least the longest-length variable-length codeword; and decoder shifter means connected to said first and second decoder bit storage means for providing, at each clock cycle, a decoding window output subsequence of bits from said first and second decoder bit storage means that is equal in length to the longest-length variable-length codeword and which is supplied as the input sequence to said memory means, said decoding window being directly shifted at each clock cycle in response to a control signal determined by the codeword-length output of said memory means at a previous clock cycle so that the first bit in the decoding window output subsequence is the first bit of the next variable-length codeword to be decoded, the decoding window output subsequence of said decoder shifter means also being supplied at each clock cycle as the input sequence to said first decoder storage means, said interface part supplying said second decoder bit storage means at each clock cycle with a sequence of bits that is consecutive to the sequence being supplied to the first decoder bit storage means;

and said interface part comprising:

first and second interface bit storage means for storing consecutive fixed-length segments of the input stream stored in the buffer;

interface shifter means connected to said first and second interface bit storage means for providing an output subsequence of consecutive bits from said first and second interface storage means that is equal in length to the longest-length variable-length codeword, the output subsequence being directly shifted across the bits in said first and second interface storage means at each clock cycle in response to a shift signal, said output subsequence being supplied at each clock cycle to the second decoder bit storage means; and accumulator means for adding at each clock cycle the codeword-length at the output of said memory means at the previous clock cycle to previously accumulated codeword-lengths, said added and accumulated codeword-lengths directly shifting the output subsequence of said interface shifter means so that the output subsequence of said interface shifter means being supplied to said second decoder bit storage means is always consecutive to the output subsequence of said decoder shifter means being supplied to said first decoder bit storage means, said accumulator generating a read signal to retrieve a next fixed-length segment stored in said buffer when the output subsequence of said interface shifter means is shifted to include no bits from said first interface bit storage means, said next fixed-length segment from said buffer being stored in said second interface bit storage means and the bits previously stored in said second interface bit storage means being transferred into said first interface bit storage means.

2. The decoder of claim 1 wherein said memory means is a programmable logic array.

3. The decoder of claim 1 wherein said accumulator means comprises means for summing the codeword-length of the previous decoded codeword with the previously accumulated codeword lengths modulo-(the number of bits in said fixed-length segments).

4. A variable-length decoder for decoding at a fixed clock rate sequential variable-length codewords supplied from an input buffer that stores an input bit stream to be decoded in fixed-length segments which are at least as long as the longest-length variable-length codeword, said decoder comprising:

interface means for supplying said variable-length codewords in fixed-length segments from the buffer; and memory means for producing a fixed-length codeword in response to each variable-length codeword that begins at the first bit position of an input sequence that is as long as the longest-length variable-length codeword and a codeword-length output corresponding to that variable-length codeword; and first and second decoder bit storage means for storing consecutive fixed-length sequences of bits from said interface means, said fixed-length sequences being equal in bit-length to at least the longest-length variable-length codeword; and decoder shifter means connected to said first and second decoder bit storage means for providing, at each clock cycle, a decoding window output subsequence of bits from said first and second decoder bit storage means that is equal in length to the longest-length variable-length codeword and which is supplied as the input sequence to said memory means, said decoding window being directly shifted at each clock cycle in response to a control signal determined by the codeword-length output of said memory means at a previous clock cycle so that the first bit in the decoding window output subsequence is the first bit of the next variable-length codeword to be decoded, the decoding window output subsequence of said decoder shifter means also being supplied at each clock cycle as the input sequence to said first decoder storage means; and said interface means connected to said second decoder bit storage means and said buffer supplies to said second decoder bit storage means at each clock cycle a sequence of bits from the input bit stream that is consecutive to the sequence of bits being supplied at each clock cycle to the first decoder bit storage means from the decoding window output of said decoder shifter means, said interface means comprising means for storing at least one fixed-length segment from said buffer, and means for retrieving an additional fixed-length segment from said buffer when all the bits in the first of the stored at least one fixed-length segment from the buffer have been supplied to the second decoder bit storage means.

5. The decoder of claim 4 wherein said memory means is a programmable logic array.

* * * * *